United States Patent [19]
Chia et al.

[11] Patent Number: 5,677,108
[45] Date of Patent: *Oct. 14, 1997

[54] ON-PRESS REMOVABLE QUENCHING OVERCOAT FOR LITHOGRAPHIC PLATES

[75] Inventors: Yee-Ho Chia, Lexington; Joseph Hanlon, Lowell; John M. Hardin, Jamaica Plain; Rong-Chang Liang, Newton; Yi-Hua Tsao; Tung-Feng Yeh, both of Waltham, all of Mass.

[73] Assignee: Polaroid Corporation, Cambridge, Mass.

[ * ] Notice: The term of this patent shall not extend beyond the expiration date of Pat. No. 5,599,650.

[21] Appl. No.: 430,876

[22] Filed: Apr. 28, 1995

[51] Int. Cl.⁶ .................................................. G03F 7/11
[52] U.S. Cl. ..................... 430/273.1; 430/950; 430/138
[58] Field of Search ............................. 430/273.1, 950

[56] References Cited

U.S. PATENT DOCUMENTS

| | | | |
|---|---|---|---|
| 3,507,678 | 4/1970 | Shimizu et al. | 430/950 |
| 3,753,709 | 8/1973 | Staudenmayer et al. | 96/1.5 |
| 3,753,715 | 8/1973 | Klupfel et al. | 430/273.1 |
| 4,168,979 | 9/1979 | Okishi et al. | 430/950 |
| 5,120,772 | 6/1992 | Walls et al. | 522/63 |
| 5,258,261 | 11/1993 | Heller | 430/273.1 |
| 5,340,681 | 8/1994 | Sypek et al. | 430/138 |
| 5,407,657 | 4/1995 | Unger et al. | 424/9 |
| 5,506,090 | 4/1996 | Gardner, Jr. et al. | 430/302 |
| 5,599,650 | 2/1997 | Bi et al. | 430/273.1 |

FOREIGN PATENT DOCUMENTS

| | | | |
|---|---|---|---|
| 0275147 | 7/1988 | European Pat. Off. | G03F 7/02 |
| 0335247 | 10/1989 | European Pat. Off. | G03C 1/68 |
| 0476840 | 3/1992 | European Pat. Off. | 430/273.1 |
| 0703499 | 3/1996 | European Pat. Off. | |
| 52-64924 | 5/1977 | Japan | 430/273 |
| 62-62521 | 4/1987 | Japan | 430/270 |

OTHER PUBLICATIONS

PCT International Search Report for PCT/US96/05467 (Form PCT/ISA/210) (mailed 16 Aug. 1996).
Patent Abstracts of Japan, vol. 010, No. 143 (P–459), 27 May 1986 & JP A 60 263, 141 (Fuji Shashin Film KK), 26 Dec. 1985.
Patent Abstracts of Japan, vol. 010, No. 057 (P–434), 7 Mar. 1986 & JP A 60 200,249 (Toyo Boseki KK), 9 Oct. 1985.
IBM Technical Disclosure Bulletin; vol. 12; No. 9; Feb. 1970; New York, US; pp. 1418–1419, W.M. Moreau: "Topcoat Formulation for Oxygen Sensitive Resists".

Primary Examiner—Cynthia Hamilton
Attorney, Agent, or Firm—Renato M. de Luna

[57] ABSTRACT

The present invention provides a quenching overcoat useful for application onto a lithographic printing plate, the overcoat having incorporated therein a water or fountain soluble or dispersible crystalline compound. The overcoat may be used as an oxygen barrier and/or to provide a non-tacky surface on the printing plate. By the incorporation of the crystalline compound, on-press removability of the overcoat is facilitated.

23 Claims, 3 Drawing Sheets

ON-PRESS REMOVABLE QUENCHING OVERCOAT FOR LITHOGRAPHIC PLATES

FIELD OF THE INVENTION

The present invention generally relates to an overcoat, and more particularly, to an overcoat useful for application onto a lithographic printing plate, the overcoat having incorporated therein a water or fountain soluble or dispersible crystalline compound.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric image layer (i.e., photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a softening or solubilization of the photoresist.

After photoexposure, a wet development step is normally conducted. The objective of such wet development is to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional lithographic plates prior to their use on a printing press is both time and labor consuming and involves considerable use of organic chemicals. It will appreciated that there is a considerable desire for means that would satisfactorily eliminate or reduce conventional lithography's long-felt dependency upon the conduct of wet development and thereby permit use of lithographic plates on a printing press immediately after exposure without required post-exposure prepress processing.

In the past, dry developable lithographic printing plates have been suggested which enable the wet processing steps of lithographic printing plates after exposure to be omitted and printing to be conducted by directly mounting the exposed plates on a printing press. Among printing plates that may be characterized as on-press developable (or related thereto) are: e.g., U.S. Pat. No. 4,273,851, issued to Muzyczko et al. on Jun. 16, 1981; U.S. Pat. No. 4,879,201, issued to Hasegawa on Nov. 7, 1989; U.S. Pat. No. 4,916,041, issued to Hasegawa et al. on Apr. 10, 1990; U.S. Pat. No. 4,999,273, issued to Hasegawa on Mar. 12, 1991; and U.S. Pat. No. 5,258,263, issued to Z. K. Cheema, A. C. Giudice, E. L. Langlais, and C. F. St. Jacques on Nov. 2, 1993.

Despite the methodologies and approaches embodied in the aforementioned patents, there is a continuing need for a lithographic printing plate that can be readily developed on a printing press and that produces a plate having durable image areas needed for good run length. Applications for such on-press developable printing plates have been filed.

U.S. patent application Ser. Nos. 08/147,045 and 08/146,711, filed by W. C. Schwarzel, F. R. Kearney, M. J. Fitzgerald, and R. C. Liang on Nov. 1, 1993, describe a photoreactive polymeric binder that may be used to enhance photospeed in either conventional plates or on-press developable lithographic printing plates. Briefly, a polymer of m-isopropenyl-$\alpha,\alpha$-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-$\alpha,\alpha$-dimethylbenzyl isocyanate through complexation with an electron-deficient monomer (e.g., maleic anhydride) to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion. The disclosures of commonly assigned U.S. patent application Ser. Nos. 08/147,045 and 08/146,711 are hereby incorporated by reference. Reference is also made to U.S. Pat. No. 5,514,522.

U.S. patent application Ser. No. 08/147,044, filed by F. R. Kearney, J. M. Hardin, M. J. Fitzgerald, and R. C. Liang on Nov. 1, 1993, describes the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability. The disclosure of commonly assigned U.S. patent application Ser. No. 08/147,044 is hereby incorporated by reference.

U.S. patent application Ser. No. 08/146,479, filed by L. C. Wan, A. C. Giudice, W. C. Schwarzel, C. M. Cheng, and R. C. Liang on Nov. 1, 1993, describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0. The disclosure of commonly assigned U.S. patent application Ser. No. 08/146,479, is hereby incorporated by reference.

While the practice of the subject matter set forth in the aforementioned applications can produce suitable "on-press" developable printing plates, the subject matter is desirably combined with that of U.S. Pat. No. 5,516,620, filed by L. C. Wan, A. C. Giudice, J. M. Hardin, C. M. Cheng, and R. C. Liang on Nov. 1, 1993, (commonly assigned and incorporated herein by reference). U.S. Pat. No. 5,516,620 describes a lithographic printing plate for use on a printing press, with minimal or no additional required processing after exposure to actinic radiation. Plate embodiments comprise a printing plate substrate, a polymeric resist layer capable of imagewise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or—in certain other embodiments—may be coated onto a separate substrate capable of being brought into face-to-face contact with the resist layer.

While the on-press plate development strategies mentioned above provide good results, satisfaction of requirements particular to certain applications (e.g., substantial reduction of "tackiness" of the plate and substantial reduction of cuff upon the mounting thereof) effects consideration of means to maintain or further enhance photoreactivity (e.g., photospeed), such photoreactivity being potentially compromised by said strategies. In this regard, a correlation is drawn between photoreactivity and the mechanisms underlying the generation of photoactivated (or photoexcited) reactants in a printing plate. Elevated to an excited state by exposure to actinic radiation, such photoexcited species (e.g., initiator, sensitizers, coinitiators)—the presence thereof being central to the conduct of a latent image-forming photoreaction—are sensitive to oxygen. Printing plates based on free-radical initiated photocuring mechanisms, for example, are known to be susceptible to quenching by triplet oxygen. The premature return of the photoinitiator or sensitizer from excited state to energy ground state due to undesired quenching by ambient oxygen may preclude the required energy or electron transfer to effect a desirable rate and/or degree of photocuring. The photogenerated radicals also react with the oxygen and form peroxy radicals which are relatively non-reactive in the photoreaction.

A method useful for preventing oxygen quenching of radiation-generated free-radicals would be to overcoat the base coating of a printing plate with a water-soluble polymeric resin. See e.g., U.S. Pat. Nos. 5,340,681; 5,286,594; 5,120,772; 4,999,271; 4,927,737; 4,780,392; 4,707,437; and 4,652,604. In conventional configurations, the resins are transparent, film-forming polymers. These polymers are typically inert, capable of acting act as an oxygen barrier, and soluble in water or mixtures of water and solvents.

Conventional overcoats are removed off-press, typically during bath development. Since the use of "strong" solvents and vigorous scrubbing are liberally permissible under standard bath development regimens, conventional overcoats are generally tough and resilient.

In view of its ability to reduce tackiness and improve plate photospeed by preventing oxygen quenching, it becomes desirable to provide printing plates—especially the highly fountain swellable or permeable (oftentimes "tacky") on-press developable plates discussed in U.S. patent application Ser. Nos. 08/146,479; 08/147,044; 08/147,045; and 08/146,711—with an overcoat. Such overcoat would be designed to be highly soluble in printing press fountain or ink solution, and accordingly, on-press removable. However, while advantage in terms of reduced tackiness and good photospeed is accomplished by the use of an overcoat, poor shadow resolution and low contrast are sometimes observed. Poor ink receptability (cf., "ink blinding") on initial press prints is also sometimes observed.

These shortcomings also manifest to a degree in certain on-press printing plates utilizing microencapsulated developers. See, U.S. Pat. No. 5,516,620. For example, in an "in-situ" printing plate system, microencapsulated developers are applied as an aqueous dispersion over a photosensitive imaging layer. This aqueous microcapsule layer in effect functions as an oxygen barrier layer. After exposure of the photosensitive layer through the microcapsule layer, the plate is run on the printing press. As with overcoated, fountain swellable or permeable on-press plates, loss of resolution and ink-receptability are sometimes observed.

It is advanced that loss of resolution and ink receptability can be attributed to (1) intermixing of an overcoat's hydrophilic components with surface of an underlying imaging layer where the components are either physically trapped or chemically bonded to the imaging layer's polymer gel by participating in the photoinduced free radical polymerization and grafting processes occurring in exposed areas, and (2) reduced effective oxygen concentration in non-image areas during exposure. Ultimately, however, these causative factors may be traced to the incidence of undesirable photoreactions in image and/or non-image areas on the printing plate surface. Thus, to broadly control the aforediscussed problems, means are needed for deactivating (or otherwise regulating) photoreactions at the surface of a polymeric resist without interfering with photoreactions in remaining areas. In on-press developable printing plates utilizing a non-tacky overcoat, means are also needed for enhancing the on-press removability of the overcoat.

SUMMARY OF THE INVENTION

In light of the aforediscussed problems and concerns, the present application is directed toward the incorporation of a quenching component into the design of conventional plates, "on-press" developable plates, and other plates subject to the atmospheric sensitivities of their selected latent image-forming photoreaction mechanisms, particularly free-radical based photocuring mechanisms.

In one particular embodiment, the present invention provides a printing plate capable of being made imagewise responsive to fountain and ink solutions and thereby useful for printing images on a receiving medium. The printing plate comprises a substrate having either an affinity or aversion to said ink solution; and a photoresist deposited over the substrate. The photoresist is configured to have an affinity or aversion to said ink solution substantially opposite the affinity or aversion of the substrate. The photoresist is capable of being imagewise photohardened upon imagewise exposure to actinic radiation, and comprises a photopolymerizable ethylenically unsaturated monomer having at least one terminal ethylenic group capable of forming a polymer by a free radical-initiated reaction, and a free-radical generating system activatable by actinic radiation. As an important feature of the embodiment, the printing plate further comprises a free-radical regulating system comprising a quencher component, the quencher component capable of deactivating the free-radical generating system subsequent to activation by said actinic radiation. By such quencher component, good resolution, ink receptability, and shelf-life are obtained.

In embodiments of the present invention, the quencher component is incorporated into an overcoat (or "barrier layer"). Where such embodiments are configured to be on-press developable, advantage is obtained by configuring the overcoat to be readily "on-press removable". On-press removability is advanced by the incorporation into the overcoat of fountain soluble or dispersible crystalline materials, which when solubilized or dispersed on press effects a reduction in the structural integrity of the overcoat by, for example, the creation of voids, fissures, pores, or the like therein.

In light of the above, it is a broad object of the present invention to provide a printing plate having means for regulating the occurrence of photoreactions therein, particularly means for regulating the activity of post-exposure free-radicals.

Further, it is a particular object of the present invention to provide a printing plate having a free-radical regulating system, wherein the free-radical regulating systems comprises at least a quencher component, the quencher component capable of deactivating free-radicals subsequent to the activation thereof by exposure to actinic radiation.

It is another particular objective of the present invention to provide a printing plate having a free-radical regulating system, wherein the free-radical regulating system comprises at least a quencher component, the quencher component being a polymer having a pendant free-radical quenching group.

It is another particular objective of the present invention to provide a printing plate having a free-radical regulating system, wherein the free-radical regulating system comprises at least a quencher component, the quencher component being a polymer having a pendent TEMPO group thereon.

It is another particular objective of the present invention to provide a printing plate having a free-radical regulating system, wherein the free-radical regulating system is incorporated into a clear, light-transmissive overcoat deposited over a photoresist.

It is another particular objective of the present invention to provide a printing plate having a free-radical regulating system, the printing plate having a photoresist capable of being made on-press developable by a blanketwise rupturing of microencapsulated developers, and wherein the free-radical regulating system is chemically incorporated at the surface of the microcapsule or in a matrix surrounding said microcapsule.

It is another particular objective of the present invention to provide a printing plate having a clear, light-transmissive overcoat deposited over a polymeric resist layer, the overcoat having incorporated therein a water or fountain soluble or dispersible crystalline material, whereby the on-press removability of the overcoat is enhanced.

DETAILED DESCRIPTION OF THE INVENTIVE SUBJECT MATTER

Throughout this disclosure the term "on-press" is used, for example, to describe both development and printing plates, (e.g. "on-press development", "developing on-press", "on-press developable lithographic printing plates", etc.) As used herein, the modifier "on-press"—when directed towards the concept of development—will be defined as indicating an ability to develop a useful imagewise distribution of oleophilic and hydrophobic polymeric areas on a printing press after imagewise exposure, without resort to wet development steps or like intermediary processing. (Analogous construction would be correspondingly applicable to the term "on-press removable"). "On-press"

development techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

The present invention provides several product embodiments designed to advance and improve the practice of on-press development of lithographic printing plates, as well as improve the photoresponse in printing plates based on photoreactions involving generation of a photoexcited reactant, such as a free-radical. Representative examples are illustrated in the several drawings.

In a principal embodiment, the present invention provides a printing plate comprising a substrate, a photocurable polymeric resist, and a free-radical generating system activatable by actinic radiation; the polymeric resist comprising a photopolymerizable ethylenically unsaturated monomer having at least one terminal ethylenic group capable of forming a high polymer by a free radical-initiated photo-curing reaction. To constrain detrimental and undesired activity of free radicals subsequent to exposure and prior to printing, the printing plate importantly comprises a free-radical regulating system. The free-radical regulating system comprises a quencher component, the quencher component capable of deactivating the free-radical generating system subsequent to activation by said actinic radiation. By such quencher component, good resolution, ink receptability, and shelf-life are obtained.

Figure 5:
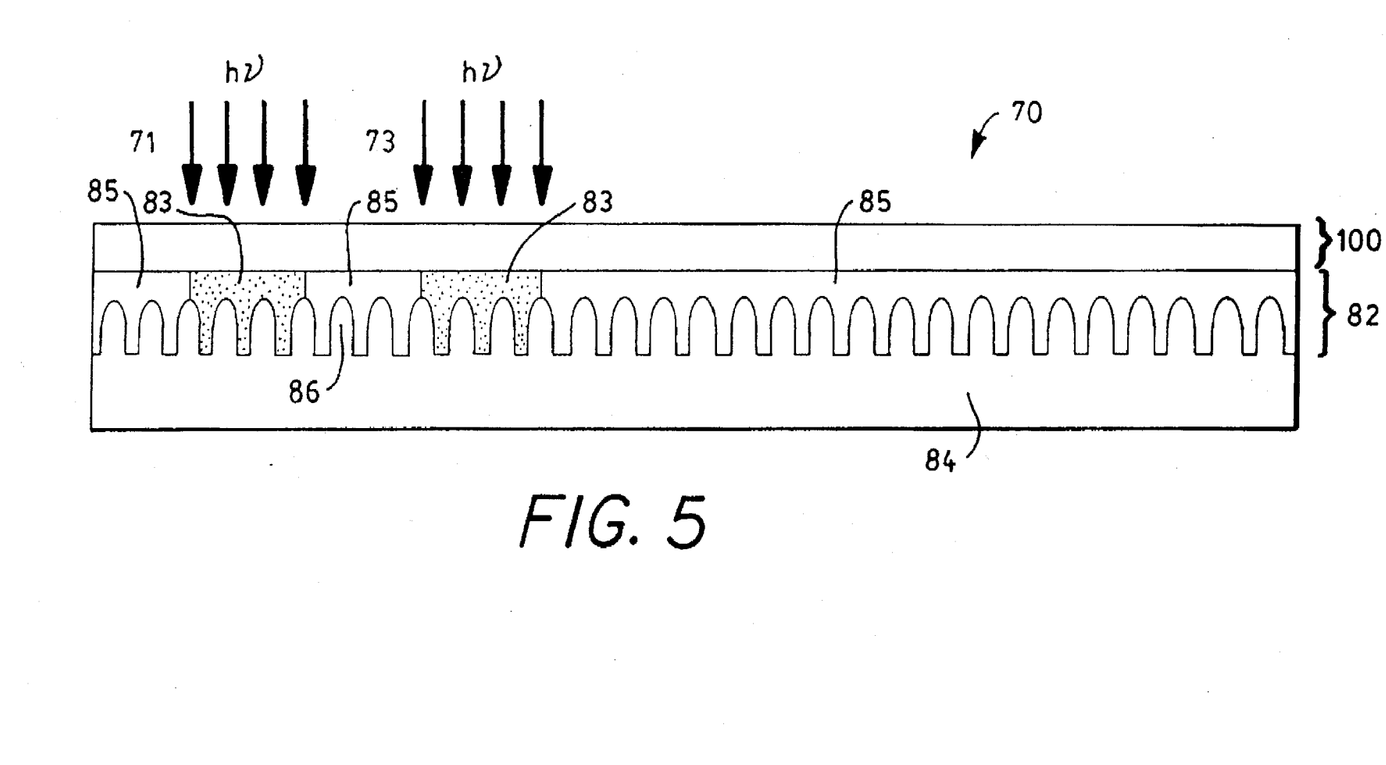
FIG. 5 is a schematic cross-sectional representation of photoexposure of either a conventional plate, or a fountain swellable or permeable on-press developable printing plate (such as those disclosed in U.S. patent application Ser. Nos. 08/146,479; 08/147,044; 08/147,045; and 08/146,711), the plate having incorporated thereon a quenching overcoat 100 according to the present invention.

In embodiments of the present invention, the free radical regulation system is provided in a non-tacky, light-transmissive overcoat. See, structure 100 in FIGS. 1, 2, and 5. A desirable overcoat would functions as a barrier to atmospheric oxygen, retarding the inhibition effects of atmospheric oxygen on the photopolymerization of the photoresist when the plate is exposed, for example, either in a standard vacuum frame exposure device or in a non-vacuum frame exposure device (for example a Rachwal or other projection exposure device). The overcoat comprises at least a water or fountain soluble or dispersible polymer bearing a quencher group capable of quenching undesirable photoreactions, particularly undesirable free radical reactions.

As noted above, advantage is obtained by configuring the overcoat to be readily "on-press removable". On-press removability is advanced by the incorporation into the overcoat of a fountain soluble or dispersible crystalline compound, which when treated on press effects a reduction in the overcoat's structural integrity. Examples of suitable crystalline compounds include sucrose, glucose, lactose, saccharides, polysaccharides, and their derivatives. A low concentration (approximately 2 to 6% by weight) is preferred. While the present inventors do not wish to be bound to any theory in explanation of their invention, it is believed that the compounds form microcrystals in the dried overcoat. When the plates are developed on-press, the microcrystals rapidly dissolve in the fountain solution, leaving behind numerous microvoids, fissures, pores, or the like, which facilitate penetration of fountain and ink through the overcoat.

Other ingredients, such as a surfactant and a second water-soluble polymer, may provide additional advantages when incorporated into the overcoat. Examples of suitable "second" polymers include but are not limited to polyvinyl alcohol, polyvinyl alcohol copolymers, acrylic ester polymers and copolymers, hydroalkyl cellulose and its derivatives, gum arabic, and gelatin. A low to medium molecular weight, partially hydrolyzed polyvinyl alcohol is preferred. Regarding surfactants, nonionic varieties having an HLB value between 10 and 14 are desirable.

A typical formulaton for an overcoats would include: 1 to approximately 100% (preferably 10 to 50%) by dry weight of a water soluble polymer bearing a quencher functionality; 0% to approximately 99% (preferably 30 to 80%) by dry weight of a second water soluble polymer such a polyvinyl alcohol, gum arabic, and hydroxyalkyl cellulose; 0% to 10% (preferably 2 to 6%) by dry weight of a readily water soluble crystalline compound such as sucrose, glucose, lactose, saccharides, polysaccharides, and their derivatives; and 0% to approximately 15% (preferable 2 to 8%) by dry weight of surfactants, preferably a combination of at least a nonionic surfactant and an anionic surfactant.

Aside from its function as a non-tacky coating, the overcoat, by inclusion therein of a quencher component, functions as the aforementioned means whereby the photoexcited reactants (e.g., free-radicals) in the "intermix" zone between the image coat (i.e., polymeric photoresist) and the overcoat, can be deactivated or otherwise regulated. In the case of photoreactions based on free-radical mechanisms, the preferred examples of quencher components are polymers having covalently bonded or otherwise derivatized thereon stable aminoxy free-radical groups such as TEMPO (2,2,6,6-tetramethyl-1-piperidinyloxy), PROXYL (2,2,5,5-tetramethyl-1-pyrrolidinyloxy), or DOXYL (4,4-dimethyl-3-oxyazolinyloxy), and other like free-radical "traps". For example, the highly efficient, free radical trap functionality of a stable piperidyloxy, free radical TEMPO, may be incorporated by using the 4-amino-, 4-hydroxy-, or 4-keto-substituted methacryloyl chloride, glycidyl acrylate (epoxy), glycidyl methacrylate, vinylazlactone, m-isopropenyl-$\alpha,\alpha$-dimethylbenzyl isocyanate, 2-isocyanatoethyl methacrylate, styrene sulfonyl chloride, and amine or hydrazide in the case of 4-keto-TEMPO. Other stable aminoxy, free radical groups such as PROXYL or DOXYL derivatives may be used instead of TEMPO, as well as other functionalities capable of equivalently serving as free radical traps, inhibitors, or retarders, such as oxime, phenol, nitro, nitroso, nitrone, hydroxamic acid, and amidoxime.

For use in embodiments of the present invention, free-radical trapping polymers have been desirably prepared by reacting 4-amino TEMPO (4-amino-2,2,6,6-tetramethyl-1-piperidinyloxy) and 2-aminoethyl sulfonic acid with EMA copolymer to give TEMPO and sulfonate substituted copolymers. Such process can be represented by the following chemical reaction (Synthesis Scheme I):

In the above reaction, M is a cation producing atom; m is from approximately 20% by weight to approximately 90% by weight; n is from approximately 0% by weight to approximately 75% by weight; o is from approximately 0% by weight to approximately 5% by weight; and p is from approximately 0% by weight to approximately 5% by weight. These sulfonate substituted copolymers are soluble or dispersible in fountain solutions (pH 4–6) typically found in printing presses. While sulfonate is not critical to the above reaction, it will be appreciated that non-sulfonate substituted copolymers are less soluble. Other strong acid substituents such as sulfate also improve solubility at these lower pHs. The sulfate or sulfonate group also reduces the degree on intermixing of the overcoat with components of the image layer, because of its low solubility in the formulation from which the resist layer is prepared.

As an alternative to synthesis directly involving 4-amino TEMPO, equivalent if not identical copolymers may be manufactured by reacting 4-amino-2,2,6,6-tetramethylpiperidine and 2-aminoethyl sulfonic acid (ASA) with poly-(ethylene)-co-(maleic anhydride) (EMA) in water, followed by oxidation. The process is represented by the following chemical reaction (Synthesis Scheme II):

-continued

In the above reaction, M is a cation producing atom; m is from approximately 20% by weight to approximately 95% by weight; n is from approximately 0% by weight to approximately 75% by weight; o is from approximately 0% by weight to approximately 5% by weight; p is from approximately 0% by weight to approximately 5% by weight, and q is 0% to approximately 50% by weight.

The quencher components may be incorporated into several types of lithographic printing plates. Several embodiments are envisioned, some of which are represented in the FIGURES.

Figure 1:
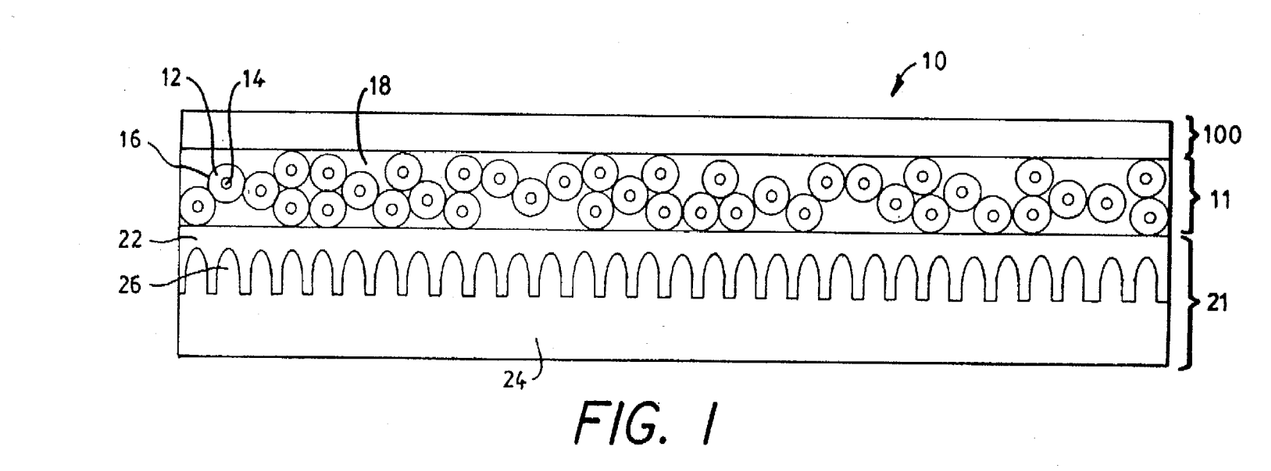
FIG. 1 of the accompanying drawings is a schematic cross-sectional representation of an embodiment of an overcoated lithographic printing plate according to the present invention.

One product embodiment, an overcoated dual-layer lithographic printing plate 10, is schematically illustrated in FIG. 1. As drawn (not to scale), overcoated dual-layer printing plate 10 comprises a plate layer 21, a microcapsule layer 11, and a continuous, light-transmissive overcoat 100. Plate layer 21 comprises a suitable printing plate substrate 24 and a polymeric photoresist layer 22. In general, polymeric resist layer 22 comprises a photopolymerizable ethylenically unsaturated monomer, a macromolecular organic binder, and a free-radical generating, addition-polymerization initiating system. Microcapsule layer 11, layered atop plate layer 21, comprises a plurality of microcapsules 16 contained in a binder matrix 18. Each of the microcapsules 16 comprises an outer shell phase ("shell") 12 and an internal encapsulant phase ("core") 14.

Continuous, light-transmissive overcoat 100, configured to be substantially impermeable to atmospheric oxygen, preferably comprises a water soluble polymer derivatized to contain "free-radical traps," such as the aforementioned TEMPO, PROXYL, and DOXYL. See, Synthesis Schemes I and II, supra. Desirably, the water-soluble polymer will have the formula:

wherein, $R_1$, $R_2$, $R_3$, and $R_4$ are hydrogen or preferably lower alkyl groups having from 1 to 5 carbon atoms, B is an alkylene group having 2-3 carbon atoms and forming a heterocyclic ring with $C_1$ and $C_2$; and X is a connecting linkage (e.g., an amide, urethane, ester, ether, or urea) connecting the heterocyclic ring to the polymer's backbone, $R_5$ is an alkyl or an aryl, and Y is a functional group (such as sulfate, sulfonate, phosphate, or quarternary ammonium salts) capable of altering the polymer's physical properties (such as solubility). Such polymer—functioning as a quencher component—is capable of deactivating the free-radical based photocuring system, particularly in the inter-mix zone between the overcoat 100 and the polymeric resist layer 22. In this manner, the lithographic printing plate is provided with a system for regulating free-radicals therein.

It will be appreciated that the embodiment illustrated in FIG. 1, may be modified within the scope of the present invention by the omission of overcoat 100 and the incorporation of the polymeric quencher in the binder matrix 18 of microcapsule layer 11. In the modified embodiment, microcapsule layer 11 would further serve the role of the omitted overcoat 100.

As illustrated in exaggerated fashion in FIG. 1, an upper surface of substrate 24 may be provided with a plurality of grains ("graining") 26 obtained by several processes discussed in further detail below. As will be noted, and which will also be discussed in further detail below, polymeric photoresist layer 22 is preferably coated onto substrate 24 above the microstructure of the grains 26, the microstructure being shown in FIG. 1 in exaggerated fashion. It is noted that in some cases, a water-soluble release layer (not shown) between the substrate 24 and the resist layer 22 may also be employed to enhance the performance of the lithographic plate.

Figure 2:
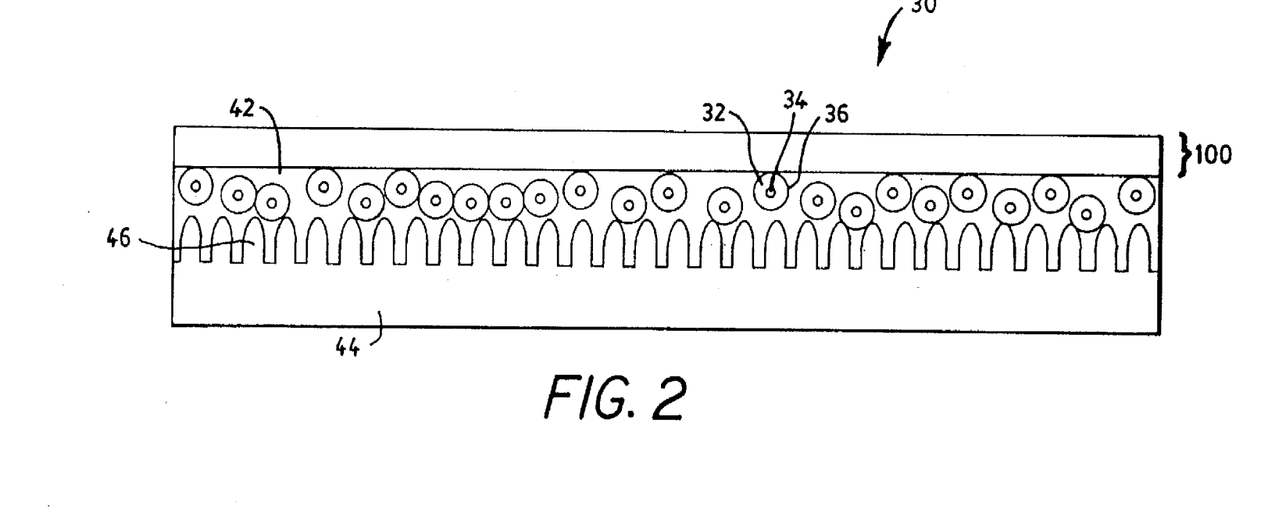
FIG. 2 is a schematic cross-sectional representation of another embodiment of an overcoated lithographic printing plate according to the present invention.

Another product embodiment, an overcoated pseudo-mono-layer lithographic printing plate 30, is initially prepared by a single-pass coating process from a coating composition comprising dispersed microcapsules, a photosensitive resist composition, and solvents. Since the coating process involves only a "single-pass", it is believed that the pseudo-mono-layer embodiment can be more easily manufactured at a lesser cost.

Overcoated pseudo-mono-layer lithographic printing plate 30 is schematically illustrated in FIG. 2. As drawn (not to scale), overcoated pseudo-mono-layer printing plate 30 comprises a substrate 44 and a free-radical activatable polymeric resist layer 42 having a plurality of microcapsules 36 interspersed therethrough. The microcapsules 36 of the mono-layer printing plate 30 comprise an outer shell phase ("shell") 32 and an internal encapsulant phase ("core") 34. As with the overcoated dual-layer printing plate 10, overcoated pseudo-mono-layer printing plate 30 further comprises a continuous, light-transmissive overcoat 100. The functionality provided by overcoat 100 in plates 10 and 30 are similar, and accordingly may be configured in a substantially similar manner.

In practice, substrate materials for use in the manufacture of printing plates will oftentimes be subjected to one or more treatments in order to improve adhesion of a photosensitive coating, or to increase the hydrophilic properties of the substrate material, and/or to improve the developability of the photosensitive coating, as is described in the aforementioned U.S. Pat. No. 4,492,616. Thus, substrates 24 and 44 will typically be treated (for example, by polyvinylphosphonic acid, silicate or by anodization, or by corona discharge or plasma treatment, or by roughening or graining treatment) to promote desired adhesion of polymeric resist layers 22 and 42.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicon rubbers and metallized plastic sheets such as poly(ethylene terephthalate).

Preferred plates are the grained aluminum plates, where the surface of the plate is roughened mechanically or chemically (e.g., electrochemically) or by a combination of roughening treatments. Anodized plates can be used to provide an oxide surface. Anodization can be performed in an aqueous alkaline electrolytic solution, including, for example, alkali metal hydroxides, phosphates, aluminates, carbonates and silicates, as is known in the art. An aluminum plate, grained and/or anodized, which, for example, has been treated with polyvinylphosphonic acid or otherwise provided with a resinous or polymeric hydrophilic layer, can be suitably employed as a substrate.

Examples of printing plate substrate materials which can be used in the production of printing plates of the invention, and methods of gaining and hydrophilizing such substrates are described, for example, in U.S. Pat. No. 4,153,461 (issued May 8, 1979 to G. Berghäuser, et al.); U.S. Pat. No. 4,492,616 (issued Jan. 8, 1985 to E. Pliefke, et al.); U.S. Pat. No. 4,618,405 (issued Oct., 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

While the present invention was particularly designed in consideration of the on-press developable lithographic printing plates described in U.S. patent application Ser. Nos. 08/146,710; 08/146,479; 08/147,044; and 08/147,045, it will be understood that a continuous, light-transmissive overcoat may be employed with advantage on any conventional lithographic printing plates. For example, using FIG. 5 for illustration, the present invention encompasses an overcoated lithographic printing plate 70 comprising a substrate 84 (advantageously grained, i.e., structure 86), a photohardenable polymeric resist 82, and a continuous light-transmissive overcoat 100. While the polymeric resist 82 comprises a photocurable monomer and a free-radical generating, addition polymerization initiating system, the embodiment represented by FIG. 5 does not require incorporation of means for advancing or promoting on-press developability. Accordingly, after exposure of portions 83 of resist 82 by actinic radiation 71 and 73, development of overcoated lithographic printing plate 70 can be conventionally accomplished, for example, by washing the plate with specific developers, organic solvents, surfactant solutions, or sometimes with water or with fountain solutions which is used in the printing arts. Washing can be effected by dipping, spraying, or coating the plate with the washing fluid and by rinsing and drying the plate. Mechanical rubbing or brushing can be employed to assist development.

Since photoexposed printing plates of the invention can be developed in absence of prior treatment with developing solution typically employed in a lithographic printing operation, it will be advantageous in most instances to eliminate post-exposure operations where possible or practical, and to place the photoexposed printing plate directly onto a printing press for "on-press" development. This affords notable advantages, including the elimination of post-exposure operations and the time saving associated with the elimination of conventional washing, gumming and other post-exposure operations.

Figure 3:
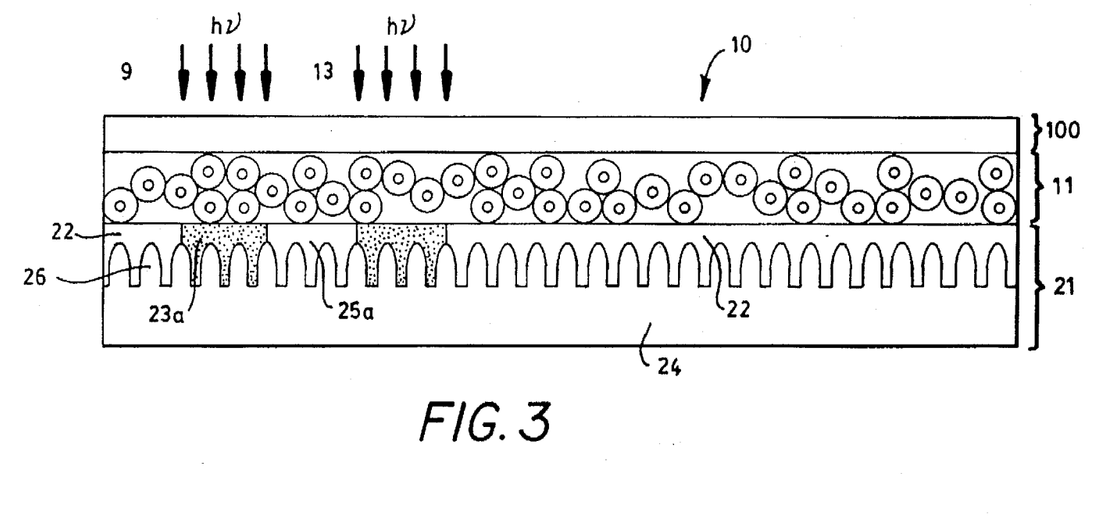
FIG. 3 is a schematic cross-sectional representation of the overcoated lithographic printing plate embodiment illustrated in FIG. 1 during exposure to actinic radiation.
Figure 4:
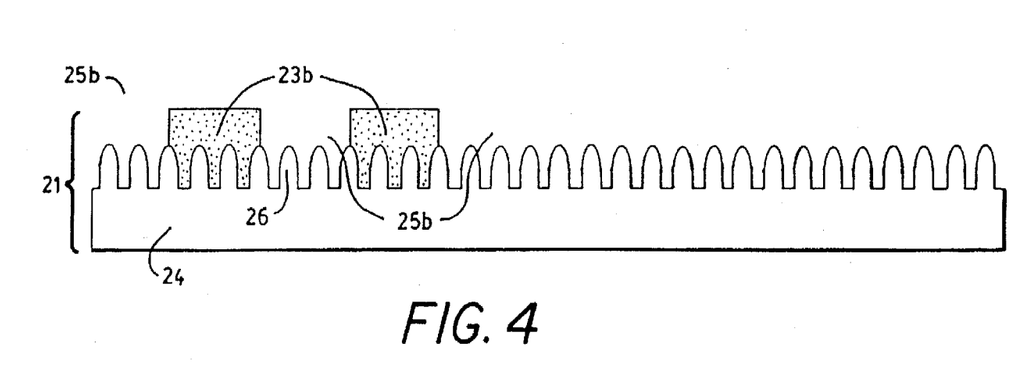
FIG. 4 is a schematic cross-sectional representation of an overcoated lithographic printing plate according to the present invention after on-press development.

One such plate that meets these "on press" criteria, is the overcoated dual-layer printing plate 10 illustrated in FIG. 1. In FIG. 3, the imagewise exposure of overcoated dual-layer printing plate 10 to actinic radiation through overcoat 100 and microcapsule layer 11 is shown. Areas of exposure are shown by reference to the arrow groupings 9 and 13. Imagewise photoexposure of overcoated dual-layer printing plate 10 to actinic radiation imagewise effects photohardening (e.g., photopolymerization) of polymeric resist layer 22 in exposed regions 23a to provide oleophilic (i.e., positive affinity to ink) printing areas. The photoexposed plate shown in FIG. 3 can then be mounted directly onto a printing press wherein unexposed regions 25a are imagewise removed by the action of developer blanketwise released from the microcapsules ruptured by press rollers, and by the contact of the plate by lithographic fountain solution and ink, thus baring the underlying substrate 24. Treatment of the plate to lithographic printing press fountain and ink solutions also serves to remove the water soluble overcoat 100. A resulting negative-working printing plate is shown in FIG. 4, wherein areas 25b result from the removal of unexposed (unhardened) areas 25a and photohardened image areas 23b of photoresist 22 remain on the hydrophilic surface of substrate 24. Optionally, the microcapsules on the exposed plate may be blanketwise ruptured by a separate pressure roller before the plates are mounted on the press.

Polymeric resist layer 22 provides several functions in the printing plates of the pertinent embodiments of the invention. Principally, however, polymeric resist layer 22 comprises the principal imaging layer of dual-layer printing plate 10 and comprises a polymeric binder and a photoactive compound which promotes degradation or hardening of the layer in photoexposed areas.

Photohardening of polymeric resist layer 22 during exposure of overcoated dual-layer plate 10 can be effected by including therein any variety of compounds, mixtures, or mixtures of reaction compounds or materials capable of being photopolymerized, photocrosslinked, photorearranged, etc., or of promoting hardening of the layer in areas of photoexposure. Compounds and materials suitable for this purpose include, but are not limited to, monomeric photopolymerizable compounds which undergo free-radical initiated photocuring. Also suitable are macromolecular or polymeric compounds having pendant groups, such as ethylenically unsaturated groups which promote crosslinking or hardening upon photoexposure or other reactive, e.g., cinnamate, groups which promote hardening by crosslinking or photodimerization.

Especially preferred for promoting photohardening of polymeric resist layer 22 is a polymerizable monomer which forms a macromolecular or polymeric material upon photoexposure, preferably a photopolymerizable ethylenically unsaturated monomer having at least one terminal ethylenic group capable of forming a polymer by, for example, free-radical initiated, chain-propagated addition polymerization. Photopolymerization can be effected by using a free-radical generating photocuring system activatable by actinic radiation.

The free-radical generating photocuring system may comprise a photoinitiator, and optionally, sensitizers and coinitiators. Among useful photoinitiators are butyl benzoin ether, isobutyl benzoin ether, ethyl benzoin ether, propyl benzoin ether, benzophenone, benzil ketals, benzoin, acetophenone (such as 2,2-dimethoxy-2-phenylacetophenone), dimethyl quinoxiline, 4,4'-bis (dialkylamino)benzophenone, ketocoumarin (such as 3-benzoyl-7-methoxy coumarin), xanthone, thioxanthone, alkyl-substituted anthraquinone, diaryl iodonium salt, triaryl sulfonium salts, azobisisobutyronitrile, azo-bis-4-cyanopentanoic acid, bistrichloromethyltriazine and its derivatives, and the like. Such photoinitiators may be used singly or in combination. Useful photosensitizers are those that have strong UV absorption characteristics at a longer wavelength, and that are capable of exciting the initiator through an electron transfer reaction, for example, ITX (a mixture of 2- and 4-isomers of isopropyl thioxanthone, available from Biddle-Sawyer), and CPTX (1-chloro-4-propoxythioxanthone-1-chloro-4-propoxy-9H-thioxanthone-9-one, also available from Biddle-Sawyer), ketocoumarin derivative, and Micheler's Ketone and its derivatives.

Preferred polymerizable monomers are the polyfunctional acrylate and methacrylate monomers such as the acrylate and methacrylate esters of ethylene glycol, trimethylolpropane and pentaerythritol. These can be polymerized in exposed regions of polymeric resist layer 22 in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyro-nitrile and azo-bis-4-cyano-pentoic acid, although others can be employed.

A photosensitive composition which comprises a water-soluble macromolecular binder, the polymerizable monomers and a photoinitiator, can be suitably coated into a layer which, upon photoexposure, undergoes insolubilization and hardening as the result of polymerization of the polymerizable monomer and grafting of the monomer onto the polymeric binder. If desired, other crosslinking agents can be included to promote crosslinking via the unsaturated moieties thereof to the polymerizable monomers or the binders.

Also suitable photosensitive components are preformed polymers which contain pendant reactive groups which are altered by photoexposure or which promote a change in the physical properties of layer 22 upon photoexposure. Such reactive groups include those which undergo rearrangement, cycloaddition, insertion, coupling, polymerization or other reactions. Preferred polymers are those having pendant ethylenically unsaturated moieties which can be crosslinked by irradiation, using a photoinitiator or a photosensitizer. Preformed polymers having pendant crosslinkable groups include, for example, the reaction product of a hydroxyl-containing polymer (e.g., a polyester of a dicarboxylic acid and a polyhydric alcohol) and a vinyl monomer containing isocyanate groups (e.g., isocyanatoethyl acrylate or methacrylate). Cross-linking agents and photoinitiators can be used to provide a cross-linked polymer having urethane linkages and hardening of polymeric resist layer 22.

If desired, preformed polymers having pendant reactive groups such as cinnamate groups can be used to promote photoinsolubilization or photohardening. For example, polyvinyl cinnamate formed by the esterification of hydroxyl groups of polyvinyl alcohol using cinnamic acid or cinnamoyl chloride, can be used to promote crosslinking by photodimerization of cinnamoyl groups.

Preformed polymers having pendant pyridium ylide groups, which groups, upon photoexposure, undergo ting expansion (photorearrangement) to a diazepine group with accompanying insolubilization can also be employed. Examples of polymers having such groups are set forth in U.S. Pat. No. 4,670,528 (issued Jun. 2, 1987 to L. D. Taylor, et al.).

The principal component of polymeric resist layer 22 for most plates is a polymeric binder which provides a hydrophobic layer of suitable oleophilicity and ink receptivity. Among preferred compositions of polymeric resist layer 22 are composition containing: a macromolecular organic binder; a photopolymerizable ethylenically unsaturated monomer having at least one terminal ethylenic group capable of forming a high polymer by free-radical initiated, chain-propagated addition polymerization; and a free-radical generating, addition polymerization-initiating system activatable by actinic radiation. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g. vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

Suitable photopolymerizable ethylenically unsaturated monomers for such composition include the difunctional, trifunctional and polyfunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; and the ethoxylates thereof. Also useful are oligomeric polyester diol diacrylate, polyether diol diacrylate, and other acrylated oligomeric polyols. Polyfunctional vinyl ethers and epoxy monomers or oligomers are also very useful when cationic photoinitiators such as diaryl iodonium and triaryl sulfonium salts are employed.

Known macromolecular binder and polymerizable monomer combination for the production of photoresists which provide lithographic printing surfaces can be suitably employed herein for the production of polymeric resist layer 22. Upon photoexposure of a polymeric resist layer 22, exposed regions 23a are hardened by the effects of homopolymerization of the polymerizable monomer and by graft polymerization, if any, involving the macromolecular binder.

Photoexposure of the printing plates can be accomplished according to the requirements dictated by the particular composition of layer polymeric resist layer 22 and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist layer 22 can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in non-exposed areas by developers. Good results are obtained by using a polymeric resist layer having a thickness in the range of from about 1 micron below to about 1 micron above the grain (preferably 0.5 microns below the grain to about 0.3 microns above the grain). On a coat weight basis, the preferred coverage of the photoresist layer is about 70 to 150 mg/ft$^2$, depending on the grain structure.

Polymeric resist layer 22 can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of placing the photoexposed plate onto a printing press for the conduct of a printing run.

In addition, the operability of the photoresist layer may be improved by the addition of certain additives. For example, polymeric resist layer 22 can contain plasticizers, photosensitizers or catalysts appropriate to the particular photoactive compound or system employed, hardeners, or other agents to improve coatability. Polymeric resist layer 22 may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis{methylene-3-(3',5'-di-t-butyl-4'-hydroxyphenyl)propionate}methane; diesters of thiedipropionic acid, triarylphosphite. It is noted however that the use of such additives is not necessary for the operability of the present invention. However, incorporation of such additives may dramatically enhance performance. It is also noted that such plasticizers, contrast dyes, imaging dyes and other additives may also be included in the microcapsules. Inclusion in the microcapsules provides a wider latitude in the selection of such additives, since neither the solubility of the additives in the photopolymerizable compositions nor the inhibition or retardation effect of some additives on polymerization would be an issue in such a system.

It will be appreciated that the components of the photoresist should be selected in consideration of compatibility with press ink solution and the desirability of maintaining the fountain/ink balance of the fluid press environment. When plates according to the present invention are developed on-press, advantage is achieved by the uptake of "removed" photoresist areas (and overcoat 100, if any) by press ink away from the fluid press environment and their subsequent deposition onto the initial units of receiving media.

The microcapsules utilized in the present invention comprise at least a core material that is a good developer for the image layer and an impermeable wall material which physically separates the core from the imaging coat. The plate would be extremely tacky if such a high level of developer were not physically separated from the image layer.

The microcapsules can be prepared by conventional coacervation processes, such as those set forth in U.S. Pat. Nos. 2,800,475, 2,800,458, 3,041,289, and 3,687,865. Also useful are interfacial polymerization processes, such as those set forth in U.S. Pat. Nos. 3,287,154, 3,492,380 and 3,557,515, U.K. Pat. Nos. 990,443, 1,046,409 and 1,091,141, Japanese Patent Publications Nos. 38(1963)-19574, 42(1967)-446, 42(1967)-771; in situ polymerization processes, such as those set forth in U.S. Pat. No. 4,001,140, U.K. Pats. Nos. 867,797 and 989,264; Japanese Patent Publication Nos. 12,380/62, 14,327/62, 29,483/70, 7,313/71 and 30,282/71; a process utilizing isocyanate-polyol wall material as that set forth in U.S. Pat. No. 3,795,669; a process of using isocyanate wall materials as described in U.S. Pat. No. 3,914,511; a process of using urea-formaldehyde-resorcinol wall forming material as described in U.S. Pat. Nos. 4,001,140, 4,087,376 and 4,089,802; a process of using melamine-formaldehyde resins, hydroxypropyl cellulose or like as a wall forming material as described in U.S. Pat. No. 4,025,455; an electrolytic dispersion and cooling process as described in U.K. Pat. Nos. 952,807 and 965,074; and a spray-drying process as described in U.S. Pat. No. 3,111,407 and U.K. Pat. No. 930,422. Preferred microcapsules are those having a multi-layer wall around the core encapsulant. These can be made, for example, by forming a first, thin wall by an interfacial polymerization reaction, and subsequently forming a second, thicker wall by an in-situ polymerization reaction or by a coacervation process.

The first wall of the microcapsule will be typically comprised of polyurea, polyurethane, polyamide, polyester, epoxy-amine condensates and silicones. The second wall of the microcapsule is typically comprised of condensates of melamine-formaldehyde, urea-formaldehyde, resorcinol-formaldehyde, phenol-formaldehyde, gelatin-formaldehyde, or interpolymer complexes of two oppositely charged polymers such as gelatin/gum arabic and poly(styrene sulfonic acid)/gelatin.

Among the encapsulated developers that may be utilized in the microcapsules are γ-phenyllactone, γ-butyrolactone, ε-capralactone, δ-valerolactone, γ-hexalactone, δ-nonalactone, α-angelica lactone, 2-[2-(benzyloxy)ethyl]-5,5-dimethyl-1,3-dioxane, dimethylphthalate, dibutyl phthalate and other dialkyl phthalate, tricrecyl phosphate, esters of trimethylolpropane, 4-(p-acetoxyphenyl)-butan-2-one, triacetin, diesters of triethylene glycol or tetraethylene glycol, derivatives of pyrollidone, N,N-dialkylacetamide, morpholine, trialkyl-1,1,2-ethane tricarboxylate, 4,4'-trimethylenebis(1-methylpiperidine), 4,4'-trimethylene bis (1-piperidineethanol), N,N-dimethylaniline, 2,6-dialkyl-N, N-dimethylaniline, alkylbenzene sulfonamide, 3-phenoxy-1,2-propanediol, phenethyl isobutyrate, triesters of glycerin, dialkyl adipate, alkoxybiphenyl.

Preferred encapsulants are high-boiling point, low vapor pressure, water insoluble solvents and cosolvents such as dimethylphthalate, dibutylphthlate, dioctylphthalate, tricrecylphosphate 4-(p-acetoxyphenyl)-butan-2-one, δ-nonalactone, triesters of glycerin, trimethylol-propane or pentaerithriol, N,N-dialkylaniline derivatives, γ-phenylactone, toluenesulfonamide derivatives, alkoxybiphenyl, and dialkyl adipate, tributyrin, benzylacetone, benzyl benzoate, cinnamyl acetate, diethyl adipate, phenyl acetate, trimethylolpropane triacetate, trimethylolpropane tripropionate, and trimethylolpropane triacrylate and trimethacrylate.

In preparing the microcapsules with high-boiling, water insoluble developers, it has been found that the developers may be encapsulated in the presence of the following: (1) an encapsulatable organic base, preferably a tertiary amine such as derivatives of N,N-dimethylaniline, piperidine, morpholine, and ethylene diamine; (2) an oil soluble surfactant or co-surfactant with an HLB of lower than 10, preferably between 3–8. The resulting capsules may be dispersed in the coating solutions comprising of (1) a hydrophilic binder or combination of binders which are compatible with the inks and fountain solutions commonly used in the press operations, (2) a water soluble surfactant to facilitate wetting and leveling of the coating, (3) high boiling, water soluble codevelopers to promote the dissolution of the binders in the fountain solution and the development efficiency of the developers released from the capsules. Examples of suitable water soluble binders include, but are not limited to, gum arabic, cellulose ethers, dextran sulfate, pectins, polyvinyl alcohol, polyvinyl pyrrolidone, polyvinylphosphonic acid, polystyrene sulfonic acid, polyacrylic acid and their copolymers. Examples of water soluble co-developers in the coating formulation include, but are not limited to, urea, sugar, tetraethyleneglycol diacetate, triethylene diacetate, N,N,N',N'-tetrakis(2-hydroxyalkyl)ethylene diamine, trihydroxyhexane, triethanolamine, citric acid, N-alkylpyrrolidone, lithium salts, sodium bicarbonate and sodium bisulfate. Examples of surfactants include, but are not limited to, alkylphenolethylene oxide adducts such as Triton X-100, block copolymers of ethylene oxide and propylene oxide such as Pluronic L44, L64 and P65, dialkylester of sodium sulfosuccinic acid such as Aerosol OT, and silicone block copolymers such as Silwet surfactants.

Suitable methods for coating the microcapsule coating solution onto the substrate include an air knife coating method, a blade coating method, a brush coating method, a curtain coating method or a slot-and-slit coating method. These methods can be selected by one skilled in the an in view of the present disclosure.

The particle size of the microcapsule should be well-controlled in a narrow range with the mean particle size failing between 1–20 microns, preferably between 6–14 microns. Too big a capsule will result in poor processability. In this regard, it is noted that a capsule larger than 14 microns can be ruptured easily by hand. On the other hand, too small a capsule may result in a poor release of developers on the press. The compressive force at the tip of the blanket in a printing press is generally in the range of 80–250 pli which is enough to rupture most of the capsules on a highly textured plate.

For embodiments of the present invention utilizing an overlying microcapsule layer, said layer should be prepared so as to reduce scattering of the actinic radiation and thereby allow transmission of the actinic radiation to the underlying photosensitive layer. This is typically achieved by filling the microvoids or interstices among the microcapsules with water soluble binders, additives, or water re-dispersible latices which have about the same refractive indices as the microcapsules. Alternatively, the degree of light scattering by the microcapsule layer may also be reduced by applying a small amount of water or fountain solution onto the capsule layer immediately before the exposure step.

The present invention will now be described in further detail by the following non-limiting examples of several of its embodiments. Unless otherwise indicated, all parts, percents, ratios, and the like are by weight.

EXAMPLES

Preparation of TEMPO-Substituted Poly(Ethylene-Maleic Acid, Potassium Salt)

Poly(ethylene-maleic anhydride) (7.4 g) is reacted with 4-aminoTEMPO (5 g) in water containing potassium carbonate (8 g) to give half substitution with TEMPO and half hydrolysis to potassium salt.

Preparation of Poly(Ethylene-Maleic Acid, Potassium Salt) EMA-Hydrolyzed

Poly(ethylene-maleic anhydride (5.66 g) was reacted with water (300 g) containing potassium carbonate (12.4 g) to give a solution of poly(ethylene-maleic acid, potassium salt).

Example 1

A photosensitive lithographic printing plate is overcoated with a microcapsule dispersion containing encapsulated diethyl adipate developer and TEMPO substituted poly (ethylene-maleic acid, potassium salt) as an aqueous phase thickener.

The photoresist composition used for the photosensitive lithographic printing plate is formulated as shown in the following Table 1-1.

TABLE 1-1

| Preparation of Photoresist Formulation (3000 g. Batch) | | | |
|---|---|---|---|
| Component | % of Stock Solution | % in Dry Film | Gms. Stock Solution |
| Photoreactive Acrylic Binder[α] | 53 | 57.50 | 333.61 |
| Sartomer SR399 (dipentaerythritol pentaacrylate) | 20 | 32.89 | 505.65 |
| 3-benzoyl-7-methoxy coumarin | 2 | 1.60 | 246.00 |
| 4-benzoyl-4-methyl diphenyl sulfide | 3 | 1.80 | 184.50 |
| s-triazene[β] | 5 | 2.50 | 153.75 |
| Methyl Ethyl Ketone | | | 969.00 |
| Toluene | | | 161.55 |
| Cyclohexanone | | | 107.70 |
| LCV/BHT/1035 (2X) | 3.375 | 3.71 | 338.25 |
| Leuco Crystal Violet Dye (LCV) | 3 | 3.30 | |
| 2,6-di-tert-butyl-4-methyl phenol (BHT) | 0.22 | 0.24 | |
| Irganox 1035 (antioxidant from Ciba-Geigy) | 0.155 | 0.17 | |
| TOTAL | | 100.00 | 3000.00 |
| TOTAL SOLIDS | | | 307.50 |
| TOTAL SOLVENTS | | | 2692.50 |

Notes:
[α]The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. 5,516,620
[β]2-[p-(n-heptylaminocarbonyl)phenyl]-4,6-bis (trichloromethyl)-1,3,5-triazine.

The microcapsule dispersion containing encapsulated diethyl adipate developer and TEMPO substituted poly (ethylene-maleic acid, potassium salt) is formulated as shown in the following Table 1-2.

TABLE 1-2

| Preparation of Microcapsule Dispersion (30 g. Batch) | | |
|---|---|---|
| Component | % Solids | Grams |
| Microencapsulated Developer (See,USSN 08/146,710) | 33.85 | 15.92 |
| Sucrose | 15.00 | 0.42 |
| EMA-TEMPO | 3.06 | 7.93 |
| F68 | 15.00 | 0.41 |
| Triton X 100 | 15.00 | 0.10 |
| Aerosol-OT (from Fisher) | 10.00 | 0.15 |
| Lithium Chloride | 5.00 | 1.22 |
| $H_2O$ | 0.00 | 4.00 |

The coated plate is then exposed to actinic radiation from a standard mercury halide lamp having an emission peak in the ultraviolet range at 360 nm. More particularly, the plate is exposed through a UGRA target mask at 8 light units (LU) to produce a test image. The plate is then developed with a Marathon subtractive developer, gummed with a protective finisher and stored under ambient conditions. The plate is subsequently placed on a Multigraphics Form printing press and ran in standard operation.

In samples treated as above, an exposure of 8 light units (LU) was noted to give shadow microline resolution of 20μ on a printed sheet.

Comparative Example 2

A formulation similar to that in Example 1 is coated on an aluminum substrate, except that the lithographic printing plate is overcoated with a microcapsule dispersion containing encapsulated diethyl adipate developer and poly(ethylene-maleic acid, potassium salt) as an aqueous phase thickener.

The microcapsule dispersion containing encapsulated diethyl adipate developer and poly(ethylene-maleic acid, potassium salt) is formulated as shown in the following Table 2-1.

TABLE 2-1

Preparation of Comparative Microcapsule Dispersion (30 g. Batch)

| Component | % Solids | Grams |
|---|---|---|
| Microencapsulated Developer (See U.S. Pat. No. 5,516,620) | 33.85 | 15.92 |
| Sucrose | 15.00 | 0.42 |
| EMA-hydrolyzed | 2.20 | 7.93 |
| F68 | 15.00 | 0.41 |
| Triton X 100 | 15.00 | 0.10 |
| Aerosol-OT (from Fisher) | 10.00 | 0.15 |
| Lithium Chloride | 5.00 | 1.22 |
| $H_2O$ | 0.00 | 4.00 |

The coated plate is then exposed to actinic radiation from a standard mercury halide lamp having an emission peak in the ultraviolet range at 360 nm. More particularly, the plate is exposed through a UGRA target mask at 8 light units (LU) to produce a test image. As in Example 1, the plate is then developed with Marathon subtractive developer, gummed with a protective finisher and stored under ambient conditions. The plate is placed on a Multigraphics Form printing press and ran in standard operation.

In samples treated as above, an exposure of 8 light units (LU) was noted to give shadow microline resolution of 40μ on a printed sheet.

It will be appreciated that Marathon Subtractive Developer is used to eliminate variability and deficiencies in the capsule development process. Accordingly, the crosslinked polymer gel image reveals the true resolution of the completely developed lithographic printing plate. The improved resolution on the printed sheet using the plate exposed through the microcapsule dispersion containing the TEMPO-substituted polymer (vs. the plate exposed through the microcapsule dispersion containing the non-TEMPO-substituted polymer) supports the position that free radical quenching groups of the polymer inhibit free radical crosslinking on the surface of the photoimaging layer, giving rise to an increase in resolution.

Preparation of EMA-ASA-TEMPO: TEMPO and 2-Aminoethyl Sulfonate Substituted Poly(Ethylene-Maleic Acid, Sodium Salt)

In a 4 L plastic beaker, a suspension of EMA (21.2 g) (from Zealand Chemical Co., approx. avg. $M_w$: 500,000; approx. avg. $M_n$: 100,000) in 1.8 kg of water is stirred at ambient temperature by means of a mechanical stirrer at 1000 rpm. A solution of 19.6 g 4-Amino-TEMPO, 4.8 g of 2-aminoethyl sulfonic acid (Taurine, available as Aldrich 15,224-2), and 6.2 g of sodium carbonate in water (200 g) is added over 2 minutes so as to control foaming. The beaker is covered and stirring at ambient temperature is continued for 18 hours, giving a clear, yellow solution. (1541.7 g, 2.89% solids, pH 6.5; calculated: 2048 g, 2.36% solids.) All operations are done under a fume hood. See, Synthesis Scheme I, supra.

Preparation of EMA-ASA: 2-Aminoethyl Sulfonate Substituted Poly(Ethylene-Maleic Acid, Sodium Salt)

Poly(ethylene-maleic anhydride) (8 g) was reacted with 2-aminoethyl sulfonic acid (7.9 g) in water (400 g) containing sodium carbonate (3.3 g) to give the sodium salt of the sulfate substituted poly(ethylene-maleic acid, sodium salt). See, Synthesis Scheme I, supra.

Example 3

A photosensitive lithographic printing plate comprising a photoresist is deposited on an anodized aluminum substrate, then overcoated with a 0.3 μm thick protective overcoat comprising 1:1 poly vinyl alcohol (Airvol 205 from Air Products) and EMA-ASA-TEMPO (See, pertinent "Preparation", supra.). The formulation is prepared as shown in the following Table 3-1.

TABLE 3-1

Preparation of Comparative Overcoat Formulation (5 g. Batch)

| Component | % of Stock Solution | % in Dry Film | Gms. Stock Solution |
|---|---|---|---|
| EMA-ASA-TEMPO, Na | 1.40 | 45.00 | 3.21 |
| Polyvinyl alcohol (Airvol 205 from Air Products) | 3.00 | 45.00 | 1.50 |
| Pluronic L43 Surfactant (from BASF) | 5.00 | 4.00 | 0.08 |
| Sucrose | 10.00 | 2.00 | 0.02 |
| Aerosol OT | 10.00 | 2.00 | 0.02 |
| Triton X-100 | 10.00 | 2.00 | 0.02 |
| Water | — | — | 0.15 |
| TOTAL | — | 100.00 | 5.00 |

The photoresist (used @ 5.50% coating solution) is formulated as shown in the following Table 3-2.

TABLE 3-2

Preparation of Photoresist Formulation (80 g. Batch)

| Component | % of Stock Solution | % in Dry Film | Gms. Stock Solution |
|---|---|---|---|
| Acryloid Resin A-11 (from Rohm and Haas) | 10 | 6.50 | 2.86 |
| Acryloid Resin B-72 (from Rohm and Haas) | 20 | 14.00 | 3.08 |
| Photoreactive Acrylic Binder[α] Oligomer/Monomer | 20 | 15.00 | 3.30 |
| Ebecryl 8301 Oligomer (from Radcure) | 20 | 11.50 | 2.53 |
| SR 399 (from Sartomer) | 20 | 39.35 | 8.66 |
| Total Oligomer/Monomer | | 50.85 | |
| 3-benzoyl-7-methoxy coumarin | 2 | 1.40 | 3.08 |
| 4-benzoyl-4-methyl diphenyl sulfide | 3 | 1.80 | 2.64 |
| s-triazene[β] | 5 | 2.50 | 2.20 |
| Pluronic L43 Surfactant (from BASF) | 20 | 4.00 | 0.88 |
| Methyl Ethyl Ketone | | | 38.37 |
| Cyclohexanone | | | 7.56 |
| Bis OMLEV/BHT/1035 | 3.595 | 3.95 | 4.84 |
| Bis OMLEV[χ] | 3 | 3.30 | |
| 2,6-di-tert-butyl-4-methyl phenol (BHT) | 0.44 | 0.48 | |
| Irganox 1035 (antioxidant | 0.155 | 0.17 | |

TABLE 3-2-continued

Preparation of Photoresist Formulation (80 g. Batch)

| Component | % of Stock Solution | % in Dry Film | Gms. Stock Solution |
|---|---|---|---|
| from Ciba-Geigy) | | | |
| TOTAL | | 100.00 | 80.00 |
| TOTAL SOLIDS | | | 4.40 |
| TOTAL SOLVENTS | | | 75.60 |

Notes:
$^\alpha$The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. No. 5,514,522
$^\beta$2-[p-(n-heptylaminocarbonyl)phenyl]-4,6-bis (trichloromethyl)-1,3,5-triazine;
$^x$bis-(4-diethylamino-o-tolyl)-4-diethylamino phenylmethane.

The coated plate is then exposed to actinic radiation from a standard mercury halide lamp, the lamp having an emission peak in the ultraviolet range of 360 nm. In particular, the plate is exposed through a UGRA target mask at 10, 15, 20, and 25 light units (LU) to produce a test image. The plate is mounted on a Multigraphics Form printing press, subjected to 20 revolutions with fountain solution, then 10 more revolutions with fountain solution and ink, and then ran in standard printing operation.

In samples so treated, Impression #1 shows full development. Impression #100, when read for photospeed and resolution, shows a shadow microline resolution of 20μ at exposures of 10–25 light units (LU).

Comparative Example 4

An image layer formulation similar to that in Example 3 is deposited on an aluminum substrate. A conventional PVA-containing barrier layer formulation is then deposited onto the image layer. The coated plate is imagewise exposed, then mounted and ran on a Multigraphics Form printing press as in Example 3.

In samples so treated, Impression #1 shows partial development. Impression #100, when read for photospeed and resolution, shows a shadow microline resolution of 30μ at exposures of 10–20 light units (LU), and 40μ at 25 light units (LU).

Comparative Example 5

An image layer formulation similar to that in Example 3 is deposited onto an aluminum substrate. The lithographic printing plate is not overcoated. The plate is imagewise exposed, then mounted and ran on a Multigraphics Form printing press as in Example 3.

In samples so treated, Impression #1 shows partial development. Impression #100, when read for photospeed and resolution, shows shadow microline resolution of 25μ at exposures of 10–15 light units (LU), and 40μ at 20–25 light units (LU).

Comparative Example 6

An image layer formulation similar to that in Example 3 is deposited onto an aluminum substrate. A solution containing 1:1 PVA (Airvol 205 from Air Products) and EMA-ASA is deposited onto the image layer at a thickness aim of 0.3μ. The overcoat solution is formulated as shown in the following Table 6-1.

TABLE 6-1

Preparation of Comparative EMA-ASA Overcoat Formulation (5 g. Batch)

| Component | % of Stock Solution | % in Dry Film | Gms. Stock Solution |
|---|---|---|---|
| EMA-ASA | 1.40 | 45.00 | 3.21 |
| Polyvinyl alcohol (Airvol 205 from Air Products) | 3.00 | 45.00 | 1.50 |
| Pluronic L43 Surfactant (from BASF) | 5.00 | 4.00 | 0.08 |
| Sucrose | 10.00 | 2.00 | 0.02 |
| Aerosol OT | 10.00 | 2.00 | 0.02 |
| Triton X-100 | 10.00 | 2.00 | 0.02 |
| Water | — | — | 0.15 |
| TOTAL | — | 100.00 | 5.00 |

The coated plate is imagewise exposed, then mounted and ran on a Multigraphics Form printing press as in Example 3.

In samples so treated, Impression #1 shows partial development. Impression #100, when read for photospeed and resolution, shows shadow microline resolution of 55μ at exposures of 10–25 light units (LU).

The observations for samples prepared in the manner of Examples 3–6 are summarized as shown in the following Table OPD:

TABLE OPD

Summary of Observations in Examples 3–6

| Example Number | Exposure (LU) | Gel Max | Highlight Dots | Shadow Dots | Highlight Microlines | Shadow Microlines |
|---|---|---|---|---|---|---|
| Example 3 | 25 (air) | 1–4 | 90 | 40 | 10 | 25 |
| | 10 | 1–6 | 98 | 20 | 6 | 20 |
| | 15 | 2–7 | 98 | 20 | 4 | 20 |
| | 20 | 3–7 | 98 | 20 | 4 | 20 |
| | 25 | 3–8 | 98 | 20 | 4 | 20 |
| Example 4 | 25 (air) | 1–11 | 99 | 20 | 4 | 30 |
| | 10 | 5–12 | 99 | 20 | 4 | 30 |
| | 15 | 5–12 | 99 | 20 | 4 | 30 |
| | 20 | 6–11 | 99 | 20 | 4 | 30 |
| | 25 | 7–12 | 99 | 20 | 4 | 40 |
| Example 5 | 25 (air) | 4–8 | 90 | 50 | 12 | 70 |
| | 10 | 5–9 | 99 | 20 | 4 | 25 |
| | 15 | 7–10 | 99 | 20 | 4 | 25 |
| | 20 | 8–11 | 99 | 20 | 4 | 40 |
| | 25 | 9–12 | 99 | 20 | 4 | 40 |
| Example 6 | 25 (air) | 4–12 | 97 | 50 | 30 | 70 |
| | 10 | 7–13 | 98 | 40 | 6 | 55 |
| | 15 | 8–15 | 98 | 50 | 6 | 55 |
| | 20 | 6–15 | 98 | 50 | 6 | 55 |
| | 25 | 8–15 | 98 | 50 | 6 | 55 |

Poor shadow microline resolution is most indicative of false gel due to light scattering and intermixing. Table OPD shows the improved resolution on the printed sheet using the plate exposed through the overcoat containing the EMA-ASA-TEMPO polymer (vs. the plates exposed through the overcoat containing PVA alone, no overcoat, or the non-TEMPO polymer EMA-ASA) and supports the hypothesis that free radical quenching groups of this polymer inhibit free radical crosslinking on the surface of the polymeric resist layer, giving rise to an increase in resolution.

Preparation of Non-Microcapsular On-Press Developable Printing Plates

An on-press developable printing plate is prepared by depositing onto an aluminum substrate a resist formulation prepared in accordance with the recipes (Resist A and Resist B) set forth in the following Table RA-RB.

TABLE RA-RB

Preparation of Photoresist Formulation (% of Film Solids)

| Component | Resist-A | Resist-B |
|---|---|---|
| Acryloid Resin A-11 (from Rohm and Haas) | 6.50 | 6.50 |
| Acryloid Resin B-72 (from Rohm and Haas) | 14.00 | 14.00 |
| Photoreactive Acrylic Binder[α] | 15.00 | 15.00 |
| Ebecryl 8301 Oligomer (from Radcure) | 7.00 | 11.50 |
| SR 399 (from Sartomer) | 48.05 | 39.35 |
| 3-benzoyl-7-methoxy coumarin | 1.40 | 1.40 |
| 4-benzoyl-4-methyl diphenyl sulfide | 1.80 | 1.80 |
| s-triazene[β] | 2.50 | 2.50 |
| Pluronic L43 Surfactant (from BASF) | 4.80 | 4.00 |
| Leuco Crystal Violet Dye | 3.30 | 3.30 |
| 2,6-di-tert-butyl-4-methyl phenol (BHT) | 0.48 | 0.48 |
| Irganox 1035 (antioxidant from Ciba-Geigy) | 0.17 | 0.17 |

Notes:
[α]The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. No. 5,514,522.
[β]2-[p-(n-heptylaminocarbonyl)phenyl]-4,6-bis(trichloromethyl)-1,3,5-triazine.

Example 7

An overcoat formulation containing 94% polyvinylalcohol (PVA 205 or 603) 2.5% sucrose, 2.5% Pluronic L43, and 1% TX-100 is coated (coating thickness~0.32 μm) onto printing plates having thereon either Resist-A or Resist-B. Control plates are left "uncoated".

A standard "toner test" using du Pont Cromalin 4/C Magenta Toner is then conducted. The toner is spread over a plate using a soft cotton pad, with excess toner being wiped off. Control plates are not treated with toner. A densitometer set on magenta is used to read the toner dye density.

Under evaluation, the control plates show a dye density of approximately 1.4–1.57 ("tacky"). In comparison, coated plates show dye densities of approximately 0.6. A reading of 0.6 is at $D_{min}$ of the printing plate, indicating no toner pickup and hence no tack.

Example 8

An overcoat formulation containing 90% polyvinyl alcohol (PVA 603), 2% sucrose, 4% Pluronic L43, 2% Aerosol OT, and 2% TX-100 is coated (coating thickness~0.32 μm) onto printing plates having thereon Resist-A. Control plates are left "uncoated".

The plates are then evaluated for photospeed. The evaluation is tabulated in the following Table 8-1.

TABLE 8-1

Resolution of Plates With And Without Overcoats After 100 Impressions.

| | With PVA Overcoat | | | | | | Without PVA Overcoat | | | | | |
|---|---|---|---|---|---|---|---|---|---|---|---|---|
| Lu | $G_{max}$ | $G_{min}$ | Hi | Sh | Hiμ | Shμ | $G_{max}$ | $G_{min}$ | Hi | Sh | Hiμ | Shμ |
| 4 | 8 | 14 | 98 | 20 | 4 | 25 | 1 | 7 | 98 | 10 | 4 | 20 |
| 8 | 10 | 15 | 98 | 20 | 4 | 25 | 2 | 8 | 98 | 10 | 4 | 20 |
| 12 | 11 | 16 | 98 | 20 | 4 | 30 | 3 | 9 | 98 | 10 | 4 | 20 |
| 16 | 13 | >16 | 98 | 30 | 4 | 40 | 4 | 9 | 98 | 10 | 4 | 25 |
| 20 | 12 | >16 | 98 | 30 | 4 | 55 | 4 | 10 | 98 | 20 | 4 | 25 |

Notes: G: Gel; Hi: Highlight; Sh: Shadow; μ: microline.

The faster photospeed for the sample with the PVA overcoat is reflected in the increase in the $G_{max}$ value by 7 steps at correspondent exposures.

Example 9

An overcoat formulation containing 90% polymeric quencher, 2% sucrose, 4% Pluronic L43, 2% Aerosol OT, and 2% TX-100 is coated onto printing plates having thereon Resist-A. Subsequent evaluation reveals lack of ink receptability ("blinding") on initial impressions. However, the plates are "clean" after 50 impressions. Resolution after 100 impressions is summarized in the following Table 9-1.

TABLE 9-1

Resolution Of Resist-A Plate Overcoated With Quencher Polymer After 100 Impressions.

| LU | $G_{max}$ | $G_{min}$ | Hi | Sh | Hiμ | Shμ |
|---|---|---|---|---|---|---|
| 2 | 2 | 4 | 90 | 20 | 10 | 25 |
| 3 | 3 | 5 | 98 | 10 | 6 | 20 |
| 4 | 4 | 6 | 98 | 10 | 6 | 20 |
| 5 | 4 | 7 | 98 | 10 | 6 | 20 |
| 6 | 5 | 7 | 99 | 20 | 4 | 25 |

Notes: G: Gel; Hi: Highlight; Sh: Shadow; μ: microline.

Examples 10A and 10B

For Example 10A, an overcoat formulation containing 90% PVA (PVA 603), 2% sucrose, 4% Pluronic L43, 2% Aerosol OT, and 2% TX-100 is coated onto printing plates having thereon Resist-A.

For Example 10B, an overcoat formulation containing 63% PVA (PVA 603), 27% polymeric quencher, 2% sucrose, 4% Pluronic L43, 2% Aerosol OT, and 2% TX-100 is coated onto printing plates having thereon Resist-A.

The resolution for Examples 10A and 10B are evaluated. The Evaluation is summarized in the Following Table 10AB-1.

TABLE 10AB-1

Resolution of Plates With And
Without Polymeric Quencher After 100 Impressions.

| Without Polymeric Quencher (Ex. 10A) | | | | | | With Polymeric Quencher (Ex. 10B) | | | | | |
|---|---|---|---|---|---|---|---|---|---|---|---|
| LU | $G_{max}$ | $G_{min}$ | Hi | Sh | Hi$\mu$ | Sh$\mu$ | LU | $G_{max}$ | $G_{min}$ | Hi | Sh | Hi$\mu$ | Sh$\mu$ |
| 0.5 | 4 | 8 | 98 | 20 | 4 | 20 | 2 | 1 | 4 | 98 | 20 | 4 | 20 |
| 1.0 | 6 | 10 | 98 | 20 | 4 | 25 | 3 | 2 | 6 | 98 | 20 | 4 | 20 |
| 1.5 | 7 | 11 | 98 | 20 | 4 | 25 | 4 | 3 | 7 | 98 | 20 | 4 | 25 |
| 2.0 | 7 | 12 | 98 | 20 | 4 | 30 | 5 | 4 | 7 | 98 | 20 | 4 | 25 |
| 2.5 | 7 | 12 | 98 | 20 | 4 | 30 | 6 | 4 | 8 | 98 | 20 | 4 | 30 |

Notes: G: Gel; Hi: Highlight; Sh: Shadow; $\mu$: microline.

The resolution of the plate with an overcoat containing quencher gives sharper contrast and slightly better resolution. When values of $G_{max}$ and $G_{min}$ are plotted against run length, samples prepared in accordance with Example 10A drop several stops ($G_{max}$) after 500 impressions and remain the same after 5000 impressions. $G_{max}$ for samples prepared in accordance with Example 10B drop continuously from the start to impression #5000. Such results may be construed as indicating that the presence of the quencher polymer in the overcoat is effective in eliminating false gels in the image layer.

Example 11

Microcapsule-containing formulations (88% tributyrin microcapsules, 2% triethanolamine, 4% Methocel EAM cellulose (Dow Chemical); 1% Pluronic L43, 0.25% TX-100; 0.25% Aerosol OT, 1% LiCl, and 3.5% sucrose) are coated onto substrate-supported resists. After lamination, the resulting plates are immediately ran on press without prior hand rubbing with fountain solution. All plates had dirty background, except those utilizing sucrose. It is believed that the presence of sucrose in the microcapsule topcoat formulation enhances the removability of the overcoat, especially in non-imaged areas.

Examples 12A and 12B

For Example 12A ("Sucrose"), an overcoat formulation containing 90% PVA (PVA 603), 2% sucrose, 4% Pluronic L43, 2% Aerosol OT, and 2% TX-100 is coated onto printing plates having thereon Resist-A.

For Example 12B ("No Sucrose"), an overcoat formulation containing 91% PVA (PVA 603), 4% Pluronic L43, 3% Aerosol OT, and 2% TX-100 is coated onto printing plates having thereon Resist-A.

Plates prepared in accordance with Examples 12A and 12B are exposed 2, 4, 6, 8, and 10 LU (Light Units). Data at start and after 100 impressions is collected and summarized in the Following Tables 12-1 and 12-2.

TABLE 12-1

Resolution Of Example 12A
Plates Before And After 100 Impressions.

| | W/Sucrose at "Start" | | | | | | W/Sucrose at Imp. #100 | | | | | |
|---|---|---|---|---|---|---|---|---|---|---|---|---|
| LU | $D_{max}$ | $D_{min}$ | Hi | Sh | Hi$\mu$ | Sh$\mu$ | $D_{max}$ | $D_{min}$ | Hi | Sh | Hi$\mu$ | Sh$\mu$ |
| 2 | 7 | 13 | 98 | 20 | 4 | 30 | 6 | 12 | 98 | 10 | 4 | 30 |
| 4 | 9 | 15 | 98 | 20 | 4 | 40 | 7 | 14 | 98 | 10 | 4 | 30 |
| 6 | 4 | >16 | 98 | 20 | 4 | 40 | 4 | 15 | 98 | 10 | 4 | 40 |
| 8 | 11 | >16 | 98 | 20 | 4 | 55 | 9 | 16 | 98 | 10 | 4 | 40 |
| 10 | 14 | >16 | 98 | 30 | 4 | 55 | 12 | >16 | 98 | 20 | 4 | 40 |

Notes: Hi: Highlight; Sh: Shadow; $\mu$: microline.

TABLE 12-2

Resolution Of Example 12B
Plates Before And After 100 Impressions.

| | W/O Sucrose at "Start" | | | | | | W/O Sucrose at Imp. #100 | | | | | |
|---|---|---|---|---|---|---|---|---|---|---|---|---|
| LU | $D_{max}$ | $D_{min}$ | Hi | Sh | Hi$\mu$ | Sh$\mu$ | $D_{max}$ | $D_{min}$ | Hi | Sh | Hi$\mu$ | Sh$\mu$ |
| 2 | 10 | 14 | 98 | 20 | 4 | 40 | 9 | 13 | 98 | 20 | 4 | 40 |
| 4 | 12 | 15 | 98 | 20 | 4 | 40 | 11 | 14 | 98 | 20 | 4 | 40 |
| 6 | 13 | 16 | 98 | 30 | 4 | 40 | 12 | 15 | 98 | 20 | 4 | 40 |
| 8 | 13 | >16 | 98 | 30 | 4 | 40 | 12 | 16 | 98 | 20 | 4 | 30 |
| 10 | 14 | >16 | 98 | 30 | 6 | 70 | 12 | >16 | 98 | 30 | 4 | 55 |

Notes: Hi: Highlight; Sh: Shadow; $\mu$: microline.

As shown in the Tables 12-1 and 12-2, plates with sucrose give better resolution (especially in microline areas) both at start and after 100 impressions, indicating that the presence of sucrose crystals in the overcoat facilitates the on-press removal of the overcoat material.

We claim:

1. An overcoated lithographic plate comprising a printing plate and an overcoat;

the printing plate capable of being made imagewise responsive to fountain and ink solutions and thereby useful for printing images on a receiving medium, the printing plate comprising a substrate and a photoresist, the substrate having either an affinity or aversion to said ink solution, the photoresist being deposited over the substrate, the photoresist having an affinity or aversion to said ink solution substantially opposite the affinity or aversion of the substrate, the photoresist being imagewise photohardenable or photodegradable in reaction to imagewise exposure to actinic radiation;

the overcoat comprising at least a first hydrophilic polymer, a second hydrophilic polymer different from the first, and a crystalline compound, and wherein the crystalline compound is water or fountain soluble or dispersible, and the second hydrophilic polymer is a polymeric quencher capable of deactivating, at a surface of said photoresist, said reaction to imagewise exposure.

2. The overcoated lithographic plate of claim 1, wherein the crystalline compound is a water-soluble oligo- or polysaccharide.

3. The overcoated lithographic plate of claim 1, wherein the crystalline compound is sucrose.

4. The overcoated lithographic plate of claim 1, wherein the overcoat comprises:

(a) approximately 10% by dry weight to approximately 50% by dry weight of said polymeric quencher;

(b) approximately 30% by dry weight to approximately 80% by dry weight of said first hydrophilic polymer; and (c) approximately 2% by dry weight to approximately 6% by dry weight of the crystalline compound.

5. The overcoated lithographic plate of claim 4, wherein the crystalline compound is a water-soluble oligo- or polysaccharide.

6. The overcoated lithographic plate of claim 5, wherein the crystalline compound is sucrose.

7. The overcoated lithographic plate of claim 6, wherein the first water-soluble polymer is poly(vinyl alcohol).

8. The overcoated lithographic plate of claim 4, wherein said substrate is hydrophilic and oleophobic, and said photosensitive layer is oleophilic.

9. The overcoated lithographic plate of claim 8, wherein said substrate is an anodized, grained aluminum substrate.

10. The overcoated lithographic plate of claim 9, wherein said photosensitive layer is deposited onto said substrate at a coverage of 70 to 150 mg/ft$^2$.

11. A lithographic plate comprising in order a substrate, a photosensitive layer, and an overcoat; and wherein (a) the photosensitive layer is imagewise photohardenable or photodegradable in reaction to imagewise exposure of said layer to actinic radiation, and (b) the overcoat comprises at least a first hydrophilic polymer, a second hydrophilic polymer different from the first, and a crystalline compound, the crystalline compound being water or fountain soluble or dispersible, the second hydrophilic polymer being a polymeric quencher capable of deactivating, at a surface of said photosensitive layer, said reaction to imagewise exposure.

12. The overcoated lithographic plate of claim 11, wherein the crystalline compound is a water-soluble oligo- or poly-saccharide.

13. The overcoated lithographic plate of claim 12, wherein the crystalline compound is sucrose.

14. The overcoated lithographic plate of claim 11, wherein the first hydrophilic polymer is poly(vinyl alcohol).

15. The overcoated lithographic plate of claim 11, wherein said substrate is hydrophilic and oleophobic, and said photosensitive layer is oleophilic.

16. The overcoated lithographic plate of claim 15, wherein said substrate is an anodized, grained aluminum substrate.

17. The overcoated lithographic plate of claim 16, wherein said photosensitive layer is deposited onto said substrate at a coverage of 70 to 150 mg/ft$^2$.

18. A lithographic plate comprising in order a substrate, a photosensitive layer, and an overcoat, the overcoat comprising at least a first hydrophilic polymer, a second hydrophilic polymer different from the first, and a crystalline compound, the crystalline compound being a water-soluble oligo- or poly-saccharide, the second hydrophilic polymer being a polymeric quencher.

19. The lithographic plate of claim 18, wherein the crystalline compound is sucrose.

20. The lithographic plate of claim 18, wherein the first hydrophilic polymer is poly(vinyl alcohol).

21. The lithographic plate of claim 18, wherein said substrate is hydrophilic and oleophobic, and said photosensitive layer is oleophilic.

22. The lithographic plate of claim 21, wherein said substrate is an anodized, grained aluminum substrate.

23. The lithographic plate of claim 22, wherein said photosensitive layer is deposited onto said substrate at a coverage of 70 to 150 mg/ft$^2$.

* * * * *